(12) United States Patent
Seo et al.

(10) Patent No.: US 7,834,705 B2
(45) Date of Patent: Nov. 16, 2010

(54) FREQUENCY SYNTHESIZER HAVING MULTI-BAND VOLTAGE CONTROLLED OSCILLATOR

(75) Inventors: Seung Won Seo, Suwon, Gyunggi-do (KR); Seung Min Oh, Osan, Gyunggi-do (KR); Byeong Hak Jo, Suwon, Gyunggi-do (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 0 days.

(21) Appl. No.: 12/205,192

(22) Filed: Sep. 5, 2008

(65) Prior Publication Data

US 2009/0066425 A1 Mar. 12, 2009

(30) Foreign Application Priority Data

Sep. 11, 2007 (KR) ...................... 10-2007-0092167

(51) Int. Cl.
*H03L 7/099* (2006.01)
*H03L 7/10* (2006.01)

(52) U.S. Cl. ............................. 331/2; 331/16; 331/179; 331/49

(58) Field of Classification Search ...................... 331/2, 331/34, 46, 49, 179, 16, 44, 1 A; 327/156
See application file for complete search history.

(56) References Cited

U.S. PATENT DOCUMENTS 5,703,540 A * 12/1997 Gazda et al. .................. 331/16
6,005,443 A    12/1999 Damgaard et al.
6,933,789 B2 *  8/2005 Molnar et al. .................. 331/2
7,180,375 B2 *  2/2007 Maeda et al. ................ 331/1 A
7,382,199 B2    6/2008 Talwalkar
2001/0006356 A1 *  7/2001 Norskov et al. ............... 331/34

OTHER PUBLICATIONS

German Office Action for application No. 102008039717.2., issued Mar. 4, 2010.

* cited by examiner

*Primary Examiner*—Benny Lee
*Assistant Examiner*—Ryan Johnson
(74) *Attorney, Agent, or Firm*—Lowe Hauptman Ham & Berner LLP

(57) ABSTRACT

There is provided a frequency synthesizer including a multi-band voltage controlled oscillator having a plurality of voltage controlled oscillating cores outputting oscillation frequencies having different bands according to an input control voltage. Each of the voltage controlled oscillating cores outputs a frequency band divided into a plurality of bands, and the voltage controlled oscillating core operates by each of the divided bands, and one of the voltage controlled oscillating cores operates in one of the bands according to the control voltage. The frequency synthesizer further includes a comparator unit and an oscillation band-determining unit. The comparator unit compares the control voltage with a pre-set reference voltage range. The oscillation band-determining unit changes the band where the voltage controlled oscillating core operates into another one of the bands when the control voltage is out of the pre-set reference voltage range.

7 Claims, 8 Drawing Sheets

FREQUENCY SYNTHESIZER HAVING MULTI-BAND VOLTAGE CONTROLLED OSCILLATOR

CROSS-REFERENCE TO RELATED APPLICATIONS

This application claims the priority of Korean Patent Application No. 2007-92167 filed on Sep. 11, 2007 in the Korean Intellectual Property Office, the disclosure of which is incorporated herein by reference.

BACKGROUND OF THE INVENTION

1. Field of the Invention

The present invention relates to a frequency synthesizer having a multi-band voltage controlled oscillator, and more particularly, to a frequency synthesizer including a multi-band voltage controlled oscillator having different voltage controlled oscillating cores according to a frequency band, which can automatically determine a frequency band where each of the voltage controlled oscillating cores operates.

2. Description of the Related Art

In general, a frequency synthesizer is a circuit that generates an output signal of a specific frequency having a predetermined phase corresponding to a reference frequency by using a phase locked loop (PLL). The frequency synthesizer with the phase locked loop may include a phase frequency detector (PFD), a charge pump (CP), a loop filter, a voltage controlled oscillator (VCO), a prescaler, and a divider. The phase frequency detector compares a pre-set reference frequency with a frequency obtained by dividing an output frequency of the frequency synthesizer output from the prescaler in a predetermined ratio in the divider, and then outputs an error signal corresponding to a difference from the comparison. The charge pump generates a control voltage of the voltage controlled oscillator depending on a size of the error signal, and the loop filter removes a high frequency component from the control voltage, and then the control voltage is input to the voltage controlled oscillator as a control signal of the voltage controlled oscillator. The voltage controlled oscillator generates a frequency corresponding to the control voltage and outputs the frequency, and the generated frequency is divided into a final desired frequency by the prescaler.

Since the voltage controlled oscillator of the frequency synthesizer includes one voltage controlled oscillating core, a range of frequencies that can be generated is limited. Particularly, as processes of manufacturing a voltage controlled oscillator are getting smaller, a range of frequencies of the voltage controlled oscillator that can be generated is being gradually limited. Thus, a voltage controlled oscillator applied to fields requiring a wide band of frequencies includes a plurality of voltage controlled oscillating cores that can generate different frequency bands from each other. Also, each of the voltage controlled oscillating cores are manufactured to divide a frequency band that each of the voltage controlled oscillating cores can generates into a plurality of bands and to operate according to each of the divided bands.

Meanwhile, the control voltage provided to the voltage controlled oscillator is limited within a predetermined range to obtain low noise characteristics. When a range of operation frequencies of the voltage controlled oscillator is changed by variations in a temperature or a process, it may be out of a range of frequencies generated by the control voltage within a predetermined range in an operation band of the voltage controlled oscillating core. In this case, the voltage controlled oscillator must change the operation band of the voltage controlled oscillating core generating an output frequency into another band of an appropriate frequency generated by the input control voltage, or change the operating voltage controlled oscillating core itself. Also, in a process of changing the operation band of the voltage controlled oscillating core, it is required to provide a bias current that optimizes noise characteristics of an output frequency of the relevant operation band.

Similarly, in the case of the prescaler, operation bands are divided according to an input frequency band. That is, the prescaler must set an appropriate operation band according to an input frequency band.

Thus, it is required in the art to develop a technology that can appropriately and automatically change an operation band of the operating voltage controlled oscillating core and provide an appropriate bias current for the changed band such that the voltage controlled oscillator outputting frequencies of multi-bands generates a frequency having excellent noise characteristics even when variations in a temperature and a process occur. It is also required in the art to develop a technology that can appropriately and automatically determine an operation band of the prescaler according to a frequency band generated by the voltage controlled oscillator.

SUMMARY OF THE INVENTION

An aspect of the present invention provides a frequency synthesizer having a multi-band voltage controlled oscillator, which can appropriately and automatically change an operation band of the operating voltage controlled oscillating core and provide an appropriate bias current for the changed band such that the voltage controlled oscillator outputting frequencies of multi-bands generates a frequency having excellent noise characteristics even when variations in a temperature and a process occur.

An aspect of the present invention also provides a frequency synthesizer that can automatically select an appropriate operation band of a prescaler according to a frequency band output from the voltage controlled oscillator.

According to an aspect of the present invention, there is provided a frequency synthesizer, including: a multi-band voltage controlled oscillator having a plurality of voltage controlled oscillating cores outputting oscillation frequencies having different bands according to an input control voltage, the plurality of voltage controlled oscillating cores each outputting a frequency band divided into a plurality of bands, the voltage controlled oscillating core operating by each of the divided bands, one of the voltage controlled oscillating cores operating in one of the bands according to the control voltage; a comparator unit comparing the control voltage with a pre-set reference voltage range; and an oscillation band-determining unit changing the band where the voltage controlled oscillating core operates into another one of the bands when the control voltage is out of the pre-set reference voltage range.

The comparator unit may include: a first comparator comparing the control voltage with a maximum value of the reference voltage range; and a second comparator comparing the control voltage with a minimum value of the reference voltage range.

The oscillation band-determining unit may include: an up/down counter generating an up-count signal when the control voltage is greater than the maximum value of the reference voltage range, and generating a down-count signal when the control voltage is less than the minimum value of the reference voltage range; a first lookup table storing information about the bands respectively corresponding to the plurality of voltage controlled oscillating cores and information about bias currents provided to the plurality of voltage controlled oscillating cores by each of the bands; and a bias current-supplying unit, when the up-count signal is generated, providing the relevant voltage controlled oscillating core with the bias current corresponding to a high frequency band among the bands adjacent to the band where the voltage controlled oscillating core is operating, by referring to the first lookup table, the bias current-supplying unit, when the down-count signal is generated, providing the relevant voltage controlled oscillating core with the bias current corresponding to a low frequency band among the bands adjacent to the band where the voltage controlled oscillating core is operating, by referring to the first lookup table.

The frequency synthesizer may further include a prescaler converting the oscillation frequencies output from the voltage controlled oscillator through a prescale operation, and the prescaler includes a plurality of different operation bands according to the oscillation frequencies.

The oscillation band-determining unit may further include a second lookup table storing information about an operation band of a prescaler corresponding to the frequency band that each of the voltage controlled oscillating cores has, and when the band where the voltage controlled oscillating core is operating is changed into another one of the bands, the prescaler may change the operation band into the operation band corresponding to the changed band of the voltage controlled oscillating core, by referring to the second lookup table.

When the frequency synthesizer includes the up/down counter and a prescaler, the oscillation band-determining unit may further include a second lookup table storing information about the operation band of the prescaler corresponding to the frequency band that each of the voltage controlled oscillating cores has, and when the up-count signal is generated, the prescaler may change the operation band into the operation band corresponding to a high frequency band among the bands adjacent to the band where the voltage controlled oscillating core is operating, by referring to the second lookup table, and when the down-count signal is generated, the prescaler may change the operation band into the operation band corresponding to a low frequency band among the bands adjacent to the band where the voltage controlled oscillating core is operating, by referring to the second lookup table.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
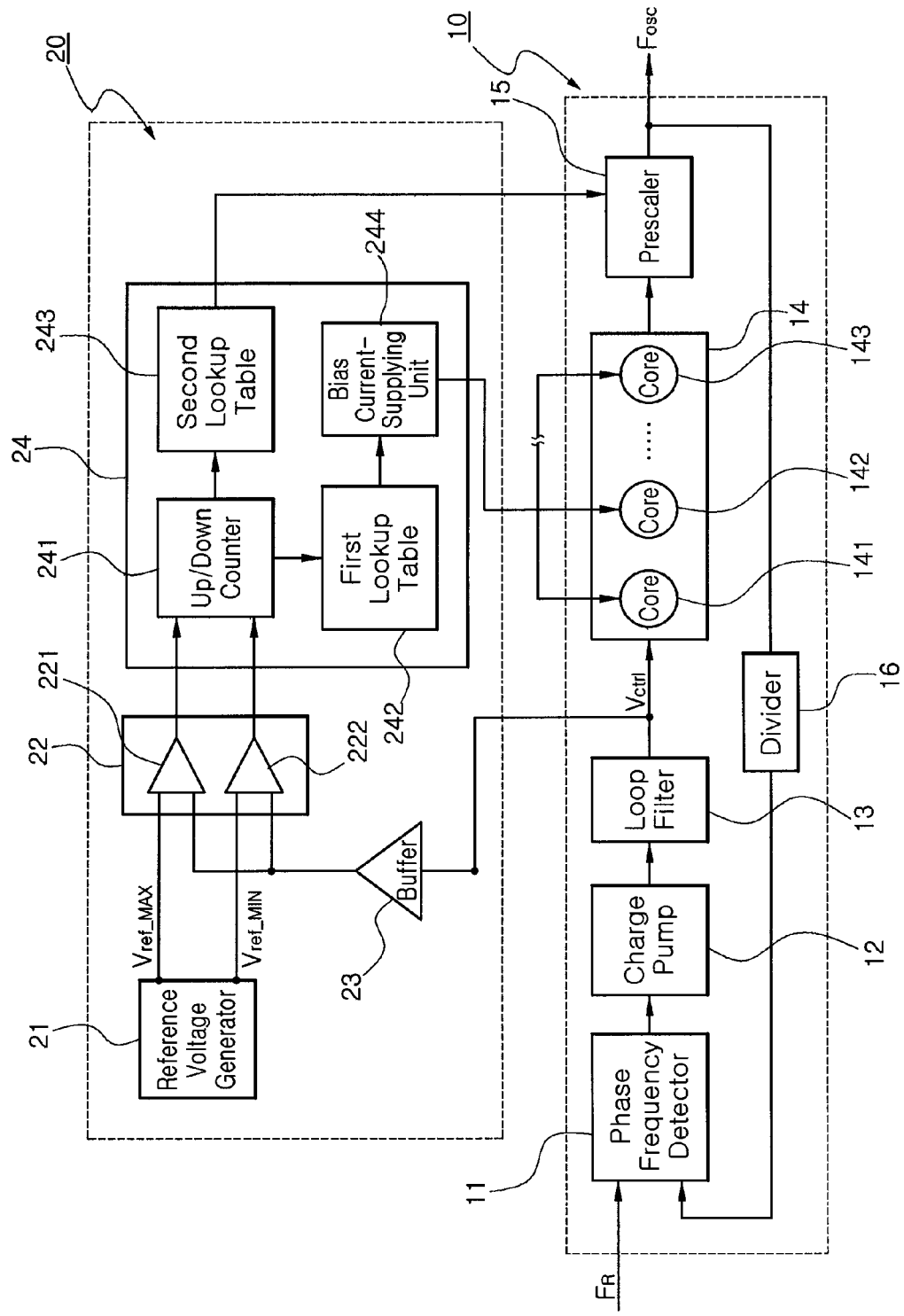
FIG. 1 is a block diagram illustrating a frequency synthesizer having a multi-band voltage controlled oscillator according to an embodiment of the present invention.

Exemplary embodiments of the present invention will now be described in detail with reference to the accompanying drawings. The invention may, however, be embodied in many different forms and should not be construed as being limited to the embodiments set forth herein; rather, these embodiments are provided so that this disclosure will be thorough and complete, and will fully convey the concept of the invention to those skilled in the art. It is noted that shapes and sizes of elements in the drawings may be exaggerated for clarity.

FIG. 1 is a block diagram illustrating a frequency synthesizer having a multi-band voltage controlled oscillator according to an embodiment of the present invention.

Referring to FIG. 1, the frequency synthesizer having the multi-band voltage controlled oscillator includes a multi-band voltage controlled oscillator 14, a comparator unit 22, and an oscillation band-determining unit 24. The multi-band voltage controlled oscillator 14 has a plurality of voltage controlled oscillating cores 141 through 143 outputting oscillation frequencies having different bands according to an input control voltage $V_{ctrl}$. The comparator unit 22 compares the control voltage $V_{ctrl}$ with a pre-set reference voltage range ($V_{ref\_MIN}$-$V_{ref\_MAX}$). The oscillation band-determining unit 24 changes bands where the voltage controlled oscillating cores 141 through 143 operate into other bands when the control voltage $V_{ctrl}$ is out of the pre-set reference voltage range ($V_{ref\_MIN}$-$V_{ref\_MAX}$).

The frequency synthesizer may further include a prescaler 15 that prescales a frequency output from the voltage controlled oscillator 14 in a predetermined ratio to output a final frequency $F_{osc}$.

The frequency synthesizer may be divided into a band selector 20 and a frequency generator 10 according to function. The frequency generator 10 is provided with a phase locked loop (PLL) including the multi-band voltage controlled oscillator 14. The band selector 20 selects the operating voltage controlled oscillating cores 141 through 143 among voltage controlled oscillating cores included in the multi-band voltage controlled oscillator 14 of the frequency generator 10 and determines operation bands of the selected voltage controlled oscillating cores 141 through 143.

The frequency generator 10 includes components used to realize the PLL. For example, the frequency generator 10 may include a divider 16, a phase frequency detector 11, a charge pump 12, a loop filter 13, and the multi-band voltage controlled oscillator 14. The divider 16 receives the final output frequency $F_{osc}$ output from the frequency synthesizer and divides the final output frequency $F_{osc}$. The phase frequency detector 11 compares a reference frequency $F_R$ with a frequency divided by the divider 16, and then outputs an error signal corresponding to a difference from the comparison of the phase frequency detector 11. The charge pump 12 outputs the control voltage $V_{ctrl}$ having a size changed depending on the error signal. The loop filter 13 removes a high frequency component from the control voltage $V_{ctrl}$ output from the charge pump 12. The multi-band voltage controlled oscillator 14 generates a frequency, which is controlled by a size of the control voltage $V_{ctrl}$.

The voltage controlled oscillator 14 includes the plurality of voltage controlled oscillating cores 141 through 143. As described above, when a band of a frequency to be generated in the voltage controlled oscillator 14 is wide, it is almost impossible to generate frequencies with a desired entire band using a single oscillating core. Thus, the voltage controlled oscillator 14 includes the plurality of voltage controlled oscillating cores 141 through 143 dividing an entire frequency band to be generated into bands and generating frequencies corresponding to the divided bands. Furthermore, each of the voltage controlled oscillating cores 141 through 143 may divide a frequency band that each of the voltage controlled oscillating cores 141 through 143 can generate into a plurality of bands and may operate according to each of the divided bands. For example, a voltage controlled oscillating core may divide a frequency band the voltage controlled oscillating core can output into 16 bands, and may operate with a different bias current in each of the divided bands. That is, operation bands of the voltage controlled oscillating core can be understood as bands with different bias currents from each other.

The prescaler 15, through a prescale operation, converts the oscillation frequency output from the voltage controlled oscillator 14 to generate the final output frequency $F_{osc}$. The prescaler 15 has a plurality of different operation bands, depending on the oscillation frequency generated in the voltage controlled oscillator 14.

The band selector 20 determines one to be operated among the voltage controlled oscillating cores 141 through 143 included in the voltage controlled oscillator 14 and further determines one of the operation bands of the determined oscillating core to provide a bias current adapted for the determined oscillating core to the determined oscillating core.

Particularly, the band selector 20 includes a reference voltage generator 21, the comparator unit 22, and the oscillation band-determining unit 24. The reference voltage generator 21 generates a maximum value $V_{ref\_MAX}$ of the reference voltage range ($V_{ref\_MIN}$-$V_{ref\_MAX}$) and a minimum value $V_{ref\_MIN}$ of the reference voltage range ($V_{ref\_MIN}$-$V_{ref\_MAX}$) for comparison with the control voltage $V_{ctrl}$. The comparator unit 22 determines whether the control voltage $V_{ctrl}$ is disposed within the reference voltage range ($V_{ref\_MIN}$-$V_{ref\_MAX}$). The oscillation band-determining unit 24 changes the bands where the voltage controlled oscillating cores 141 through 143 are operating into other bands when the control voltage $V_{ctrl}$ is out of the pre-set reference voltage range ($V_{ref\_MIN}$-$V_{ref\_MAX}$). The band selector 20 may further include a buffer 23 that temporarily stores the control voltage $V_{ctrl}$ and outputs the control voltage $V_{ctrl}$ to the comparator unit 22.

The comparator unit 22 may include a first comparator 221 and a second comparator 222. The first comparator 221 compares the control voltage $V_{ctrl}$ with the maximum value $V_{ref\_MAX}$ of the reference voltage range ($V_{ref\_MIN}$-$V_{ref\_MAX}$). The second comparator 222 compares the control voltage $V_{ctrl}$ with the minimum value $V_{ref\_MIN}$ of the reference voltage range ($V_{ref\_MIN}$-$V_{ref\_MAX}$).

The oscillation band-determining unit 24 includes an up/down counter 241, a first lookup table 242, and a bias current-supplying unit 244. The up/down counter 241 generates an up-count signal when the control voltage $V_{ctrl}$ is greater than the maximum value $V_{ref\_MAX}$ of the reference voltage range ($V_{ref\_MIN}$-$V_{ref\_MAX}$), and generates a down-count signal when the control voltage $V_{ctrl}$ is less than the minimum value $V_{ref\_MIN}$ of the reference voltage range ($V_{ref\_MIN}$-$V_{ref\_MAX}$). The first lookup table 242 stores information about the operation bands respectively corresponding to the plurality of voltage controlled oscillating cores 141 through 143 and information about the bias currents provided to the plurality of voltage controlled oscillating cores 141 through 143 by each of the operation bands. When the up-count signal is generated, the bias current-supplying unit 244 provides the bias currents corresponding to the high frequency bands adjacent to the bands where the voltage controlled oscillating cores 141 through 143 are operating to the relevant voltage controlled oscillating cores 141 through 143 by referring to the first lookup table 242. When the down-count signal is generated, the bias current-supplying unit 244 provides the bias currents corresponding to the low frequency bands adjacent to the bands where the voltage controlled oscillating cores 141 through 143 are operating to the relevant voltage controlled oscillating cores 141 through 143 by referring to the first lookup table 242. In addition, the oscillation band-determining unit 24 further includes a second lookup table 243. The second lookup table 243 stores information about the operation band of the prescaler 15 corresponding to the frequency band of each of the voltage controlled oscillating cores 141 through 143.

Hereinafter, an operation and effect of a frequency synthesizer having the above-described structure according to an embodiment of the present invention will now be described in detail.

Figure 2:
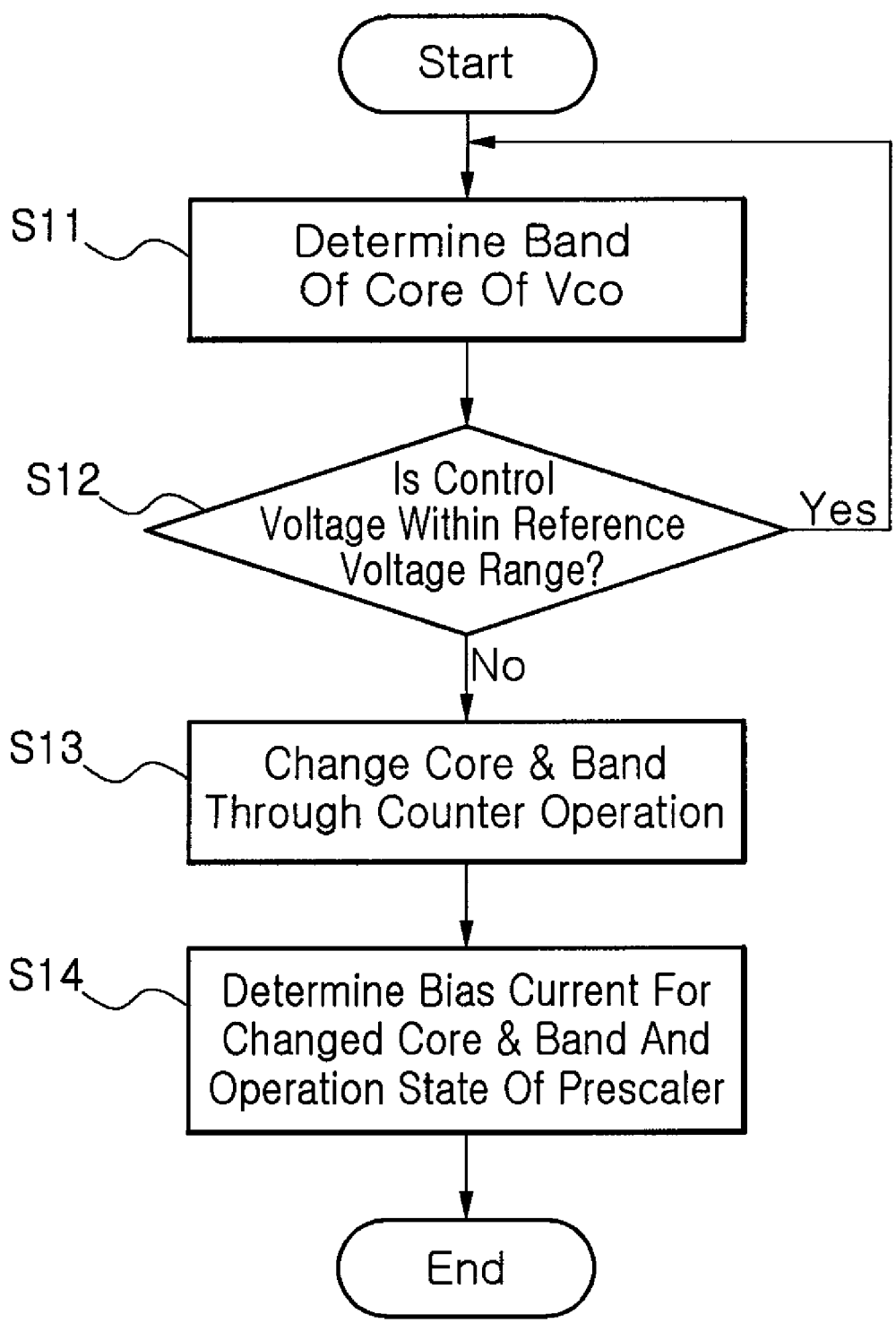
FIG. 2 is a flowchart illustrating an operation of a frequency synthesizer having a multi-band voltage controlled oscillator according to an embodiment of the present invention.

FIG. 2 is a flowchart illustrating an operation of a frequency synthesizer having a multi-band voltage controlled oscillator according to an embodiment of the present invention. Particularly, FIG. 2 is a flowchart illustrating an operation of selecting an operation band from a voltage controlled oscillator including a plurality of voltage controlled oscillating cores having a plurality of operation bands.

Referring to FIGS. 1 and 2, when the frequency synthesizer starts to operate, in operation S11, according to the frequency $F_{osc}$ to be output, the voltage controlled oscillating core to be operated and the operation band thereof are determined from the voltage controlled oscillating cores 141 through 143 included in the voltage controlled oscillator 14. An oscillation frequency output by the voltage controlled oscillating core operating in the determined band is prescaled into the final output frequency $F_{osc}$ through the prescaler 15. Then, the final output frequency $F_{osc}$ is divided in a predetermined ratio by the divider 16 and compared with the reference frequency $F_R$ in the phase frequency detector 11. The phase frequency detector 11 outputs an error signal corresponding to a difference between the reference frequency $F_R$ and a frequency output from the divider 16, and the charge pump 12 generates the control voltage $V_{ctrl}$ corresponding to the error signal. The control voltage $V_{ctrl}$ without a high frequency component through the loop filter 13 is provided to the voltage controlled oscillator 14 again.

When variations in factors including a temperature occur during the operation of this related art phase locked loop, a frequency of the operation band that can be output from the operating voltage controlled oscillating core may be out of a range where the frequency can be controlled by the control voltage $V_{ctrl}$. Such a phenomenon will now be described in detail with reference to FIG. 3.

Figure 3:
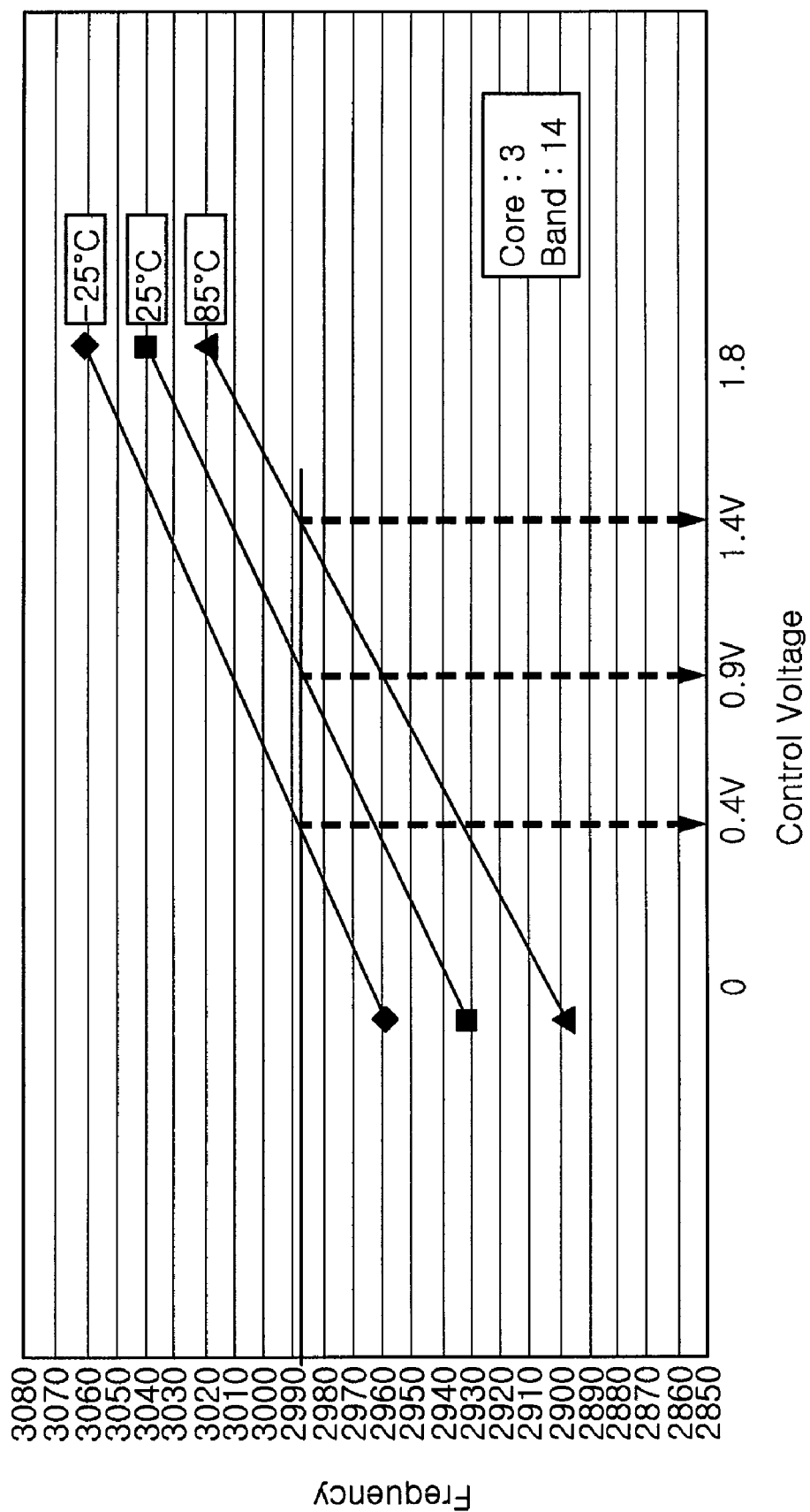
FIG. 3 is a graph illustrating variations in an operation frequency depending on temperatures in an operation band of a voltage controlled oscillating core according to an embodiment of the present invention.

FIG. 3 is a graph illustrating variations in an operation frequency depending on temperatures in an operation band of a voltage controlled oscillating core according to an embodiment of the present invention. Referring to FIG. 3, differences in a control voltage and a frequency depending on temperatures in one operation band (core 3 and band 14 illustrated in FIG. 3) of one voltage controlled oscillating core are as follows. For example, when the control voltage, at a room temperature (25° C.), ranges from 0.4 V to 1.4 V, which can vary a frequency (i.e., can control an operation of the voltage controlled oscillating core), the operation band of the relevant voltage controlled oscillating core ranges from approximately 2960 MHz to 3010 MHz. However, when the temperature changes to 85° C., an output frequency is less than 2990 MHz although the control voltage is 1.4 V. That is, although the charge pump 12 of FIG. 1 generates the control voltage of 1.4 V to output 3010 MHz in the operation band of the voltage controlled oscillating core that is operating, 3010 MHz cannot be output at the temperature of 85° C., so that a final output frequency cannot be maintained as a desired frequency. Also, to output a higher frequency, the charge pump 12 outputs a control voltage over a range that the voltage controlled oscillating core can receive. For example, as illustrated in FIG. 3, the charge pump 12 may output a control voltage over 1.4 V to output a higher frequency.

To address this limitation, the operation band of the voltage controlled oscillating core that is operating must be changed into another operation band that can output 3010 MHz at the temperature of 85° C. To this end, the band selector 20 of FIG. 1 is provided.

Referring back to FIG. 2, in operation S12, the comparator unit 22 of FIG. 1 receives the control voltage $V_{ctrl}$ and determines whether the control voltage $V_{ctrl}$ is within the reference voltage range ($V_{ref\_MIN}$-$V_{ref\_MAX}$) generated by the reference voltage generator 21. The first comparator 221 of the comparator unit 22 compares the control voltage $V_{ctrl}$ with the maximum value $V_{ref\_MAX}$ of the reference voltage range ($V_{ref\_MIN}$-$V_{ref\_MAX}$), and the second comparator 222 of the comparator unit 22 compares the control voltage $V_{ctrl}$ with the minimum value $V_{ref\_MIN}$ of the reference voltage range ($V_{ref\_MIN}$-$V_{ref\_MAX}$).

Then, a comparison result by the comparator unit 22 is input to the up/down counter 241 of the oscillation band-determining unit 24, and the up/down counter 241 generates an up-count signal or a down-count signal according to the comparison result. For example, when the control voltage $V_{ctrl}$ is greater than the maximum value $V_{ref\_MAX}$ of the reference voltage range ($V_{ref\_MIN}$-$V_{ref\_MAX}$) according to a comparison result of the comparator unit 22, an up-count signal is generated, and when the control voltage $V_{ctrl}$ is less than the maximum value $V_{ref\_MAX}$ of the reference voltage range ($V_{ref\_MIN}$-$V_{ref\_MAX}$) according to a comparison result of the comparator unit 22, a down-count signal is generated. In operation S13, through this operation of the up/down counter 241, the operation band of the voltage controlled oscillating core that is operating can be changed.

Figure 4A:
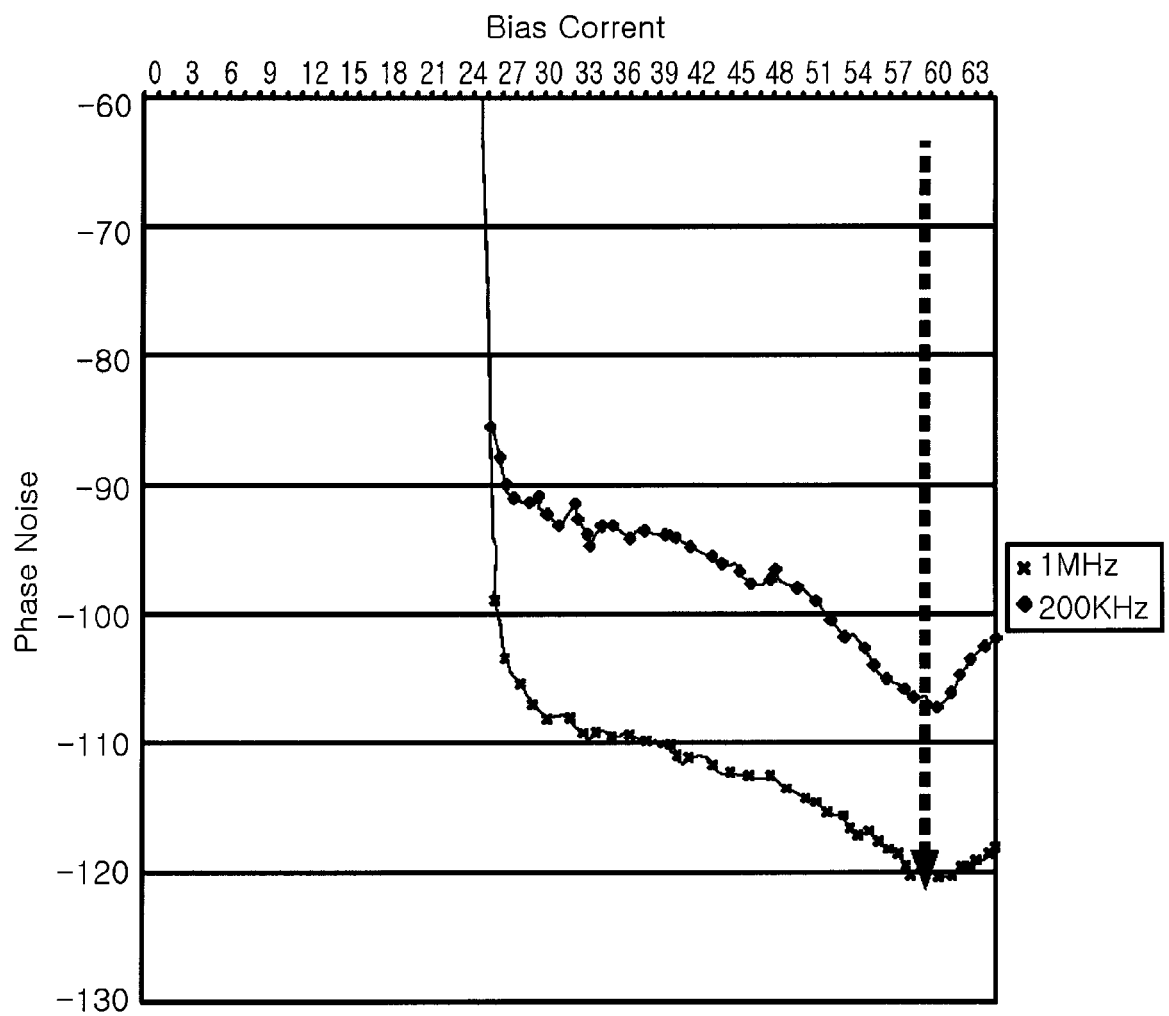
FIGS. 4A to 4C are views including graphs illustrating sizes of phase noise depending on bias currents in an operation band of a voltage controlled oscillating core according to an embodiment of the present invention.
Figure 4B:
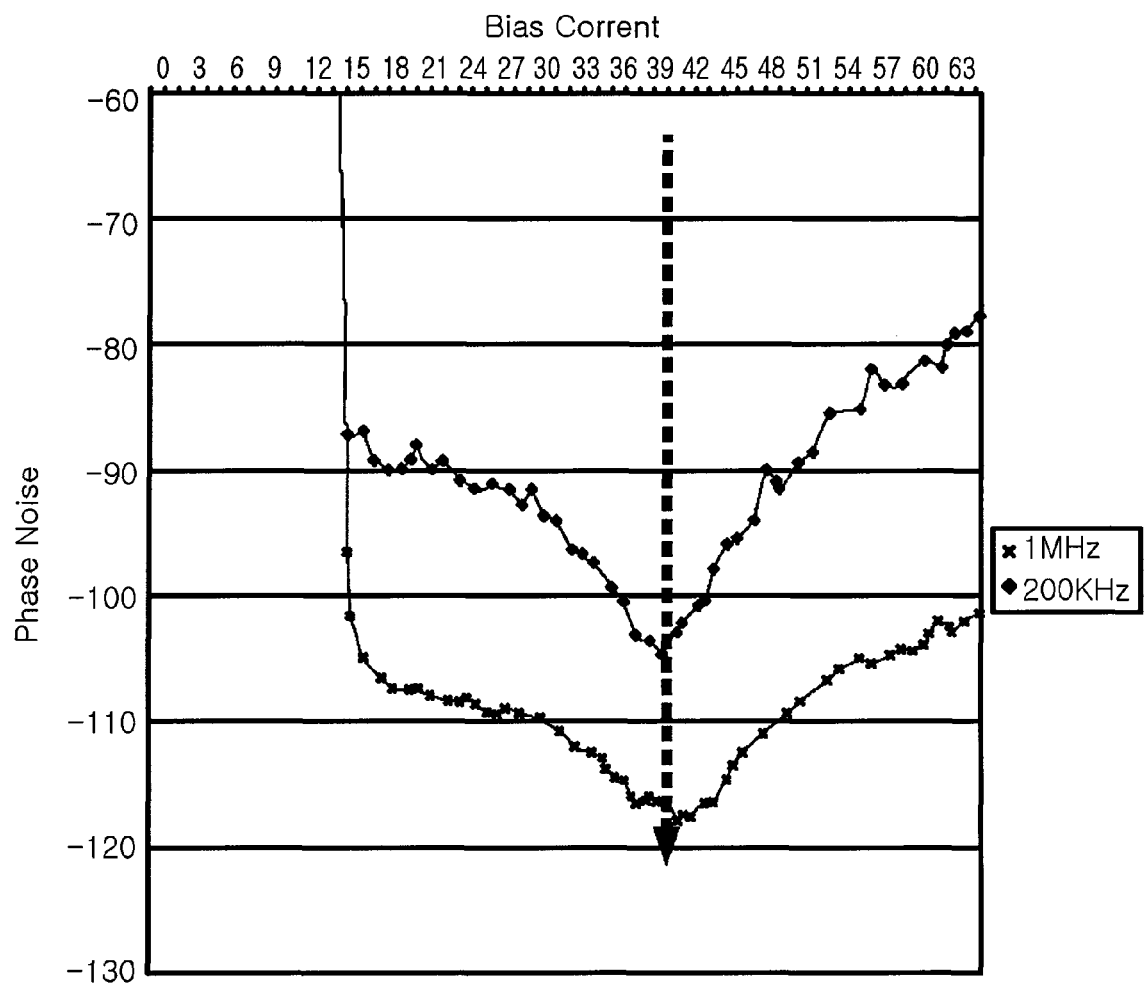
Figure 4C:
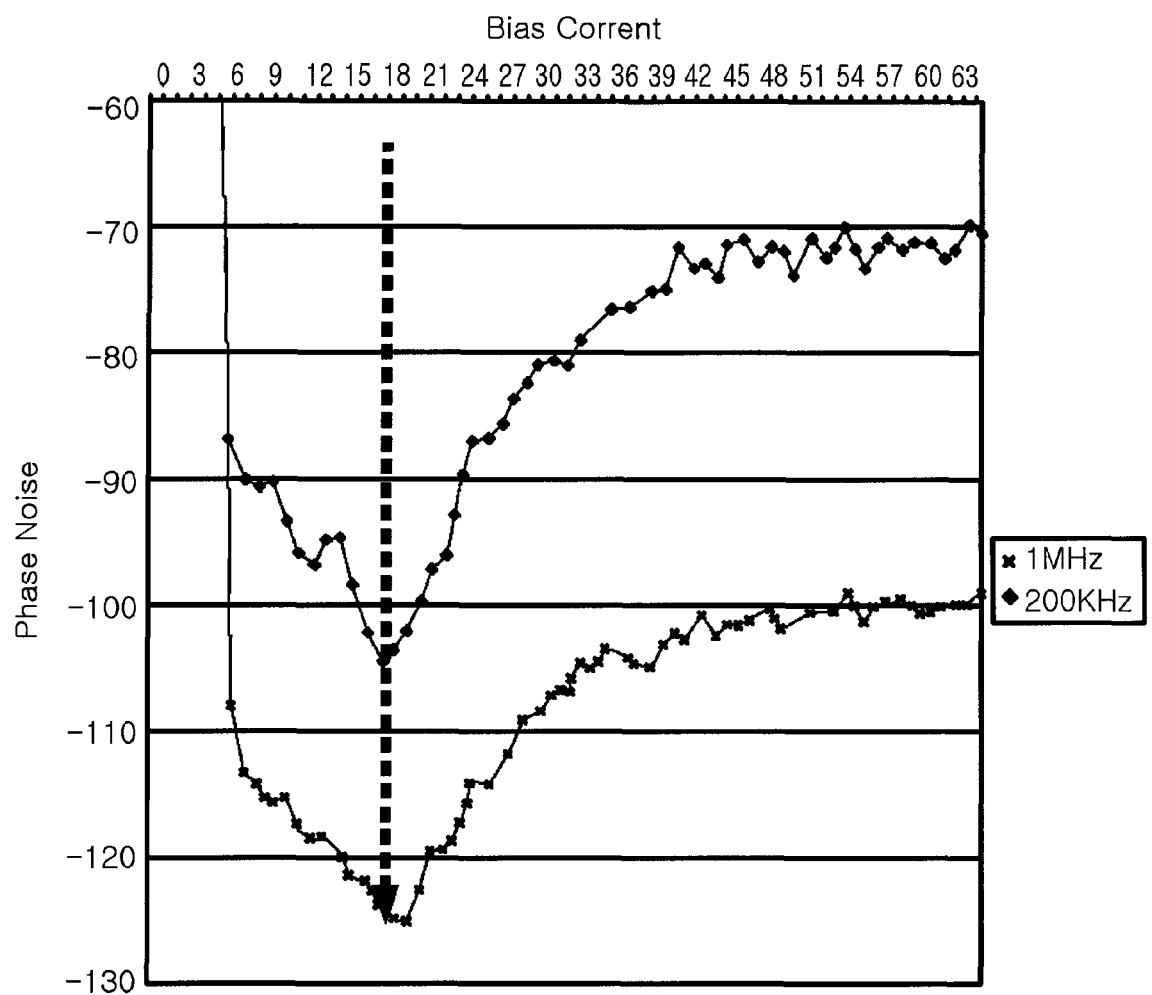

The information about the operation band of each of the voltage controlled oscillating cores 141 through 143 and the information about the bias current corresponding to each of the operation bands are stored in the first lookup table 242 of the oscillation band-determining unit 24. FIGS. 4A to 4C are views including graphs illustrating information stored in the first lookup table 242 according to an embodiment of the present invention. FIG. 4A, FIG. 4B, and FIG. 4C illustrate bias currents and phase noises with respect to different operation bands of one voltage controlled oscillating core. For convenience, the operation band illustrated in FIG. 4A is referred to as 'a', and the operation band illustrated in FIG. 4B is referred to as 'b', and the operation band illustrated in FIG. 4C is referred to as 'c'. Referring to FIGS. 4A to 4C, in the case of the band 'a', when a bias current of approximately 59 mA is provided, the phase noise is minimum, and in the case of the band 'b', when a bias current of approximately 40 mA is provided, the phase noise is minimum, and in the case of the band 'c', when a bias current of approximately 17 mA is provided, the phase noise is minimum. Thus, it is desirable that the information about the bias currents respectively corresponding to the information about the operation bands stored in the first lookup table 242 is information about optimized bias currents generating the minimum phase noise in the relevant operation bands.

When an up-count or down-count signal is generated in the up/down counter 241 of FIG. 1, the bias current-supplying unit 244 changes the operation band of the voltage controlled oscillating core that is operating.

Particularly, when an up-count signal is input to the bias current-supplying unit 244, the bias current-supplying unit 244 stops supplying the bias current corresponding to the operation band of the voltage controlled oscillating core that is operating, and supplies a bias current corresponding to an operation band having a higher frequency adjacent to the operation band of the voltage controlled oscillating core that is operating. At this point, by referring to the first lookup table 242, the bias current-supplying unit 244 identifies a bias current value provided to an upper frequency band among operation bands adjacent to the current operation band, and provides the identified bias current to a next operating voltage controlled oscillating core.

In the same manner, when a down-count signal is input to the bias current-supplying unit 244, the bias current-supplying unit 244 stops supplying the bias current corresponding to the operation band of the voltage controlled oscillating core that is operating, and supplies a bias current corresponding to an operation band having a lower frequency adjacent to the operation band of the voltage controlled oscillating core that is operating. At this point, by referring to the first lookup table 242, the bias current-supplying unit 244 identifies a bias current value provided to a lower frequency band among operation bands adjacent to the current operation band, and provides the identified bias current to a next operating voltage controlled oscillating core.

The upper and the lower operation bands adjacent to the current operation band may be the operation band of the voltage controlled oscillating core that is operating. In the case of a most upper band or a most lower band of the operation band of the voltage controlled oscillating core that is operating, an adjacent operation band for a next operation may be an operation band of another voltage controlled oscillating core.

Figure 5:
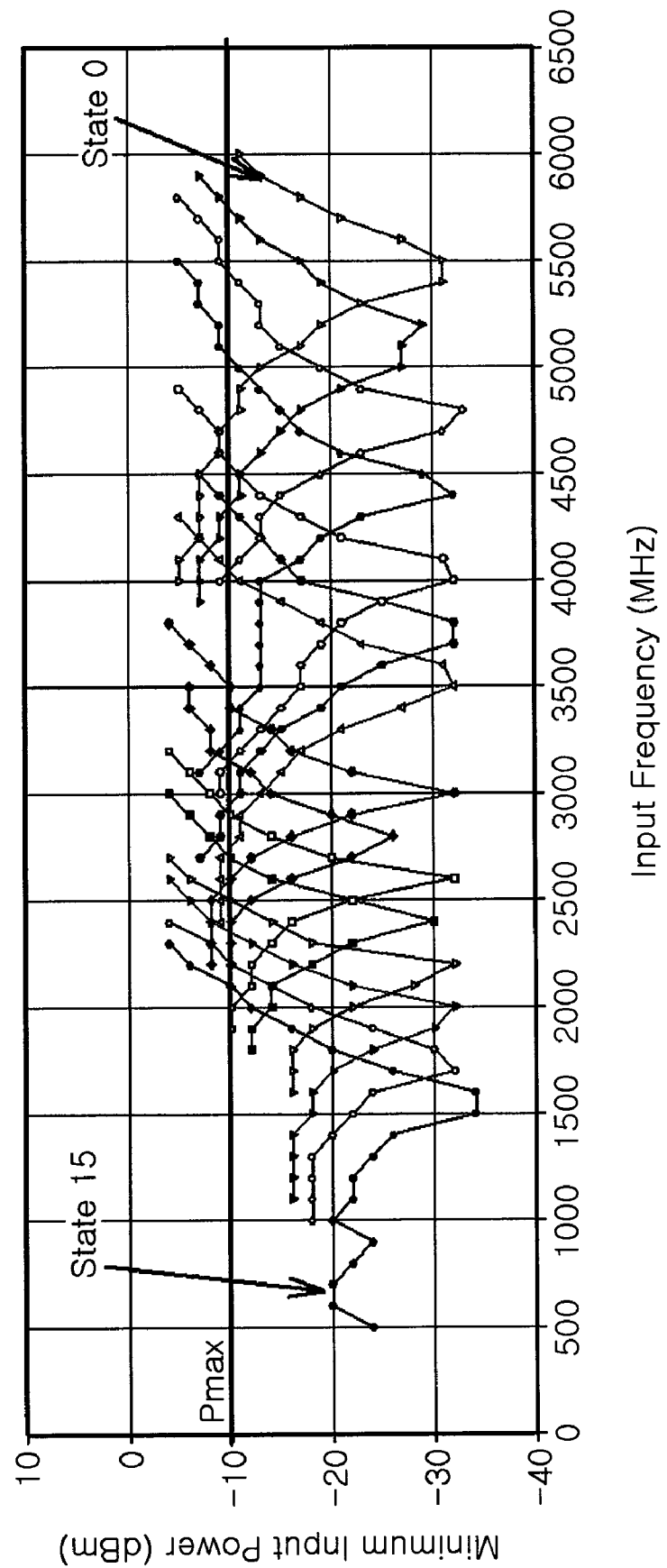
FIG. 5 is a graph illustrating operation bands of a prescaler according to an embodiment of the present invention.

As described above, the prescaler 15 of FIG. 1 also has an operation band depending on a frequency input thereto. FIG. 5 is a graph illustrating operation bands of a prescaler according to an embodiment of the present invention, which shows a relationship between an input frequency and a minimum input power in each of the operation bands. The prescaler 15 has a plurality of relationships between the input frequency and the minimum input power according to a plurality of states. When a maximum input power $P_{max}$ is determined as illustrated in FIG. 5, the prescaler 15 operates in bands having the minimum input power below the maximum input power $P_{max}$. Thus, the operation bands must be set according to the states depending on the input frequencies.

To this end, the oscillation band-determining unit 24 of FIG. 1 may further the second lookup table 243. The second lookup table 243 stores the information about the operation band of the prescaler 15 corresponding to the frequency band that each of the voltage controlled oscillating cores has. Using the second lookup table 243, the prescaler 15 detects variations in the input frequency according to the operation band of the voltage controlled oscillating core, which is changed referring to the operation of the up/down counter 241. Accordingly, the prescaler 15 changes its operation band. That is, when an up-count signal is generated in the up/down counter 241, the prescaler 15, by referring to the second lookup table 243, changes its operation band to an operation band corresponding to a high frequency band adjacent to the band where the voltage controlled oscillating core is operating. In the same manner, when a down-count signal is generated in the up/down counter 241, the prescaler 15, by referring to the second lookup table 243, changes its operation band to an operation band corresponding to a low frequency band adjacent to the band where the voltage controlled oscillating core is operating.

Figure 6A:
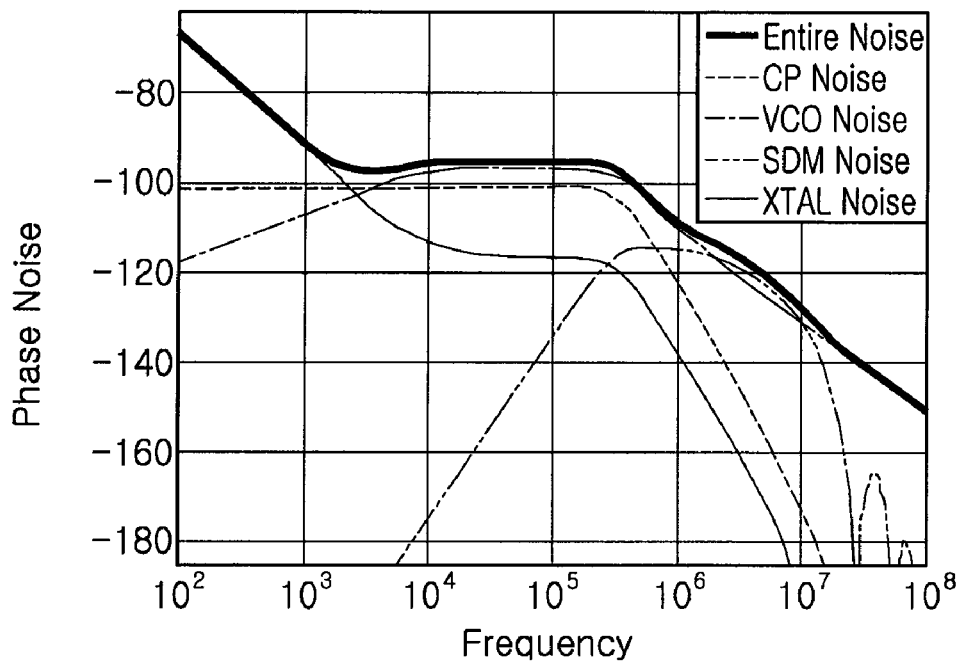
FIGS. 6A and 6B are views including graphs comparing phase noise characteristics of a related art frequency synthesizer with those of a frequency synthesizer according to an embodiment of the present invention.
Figure 6B:
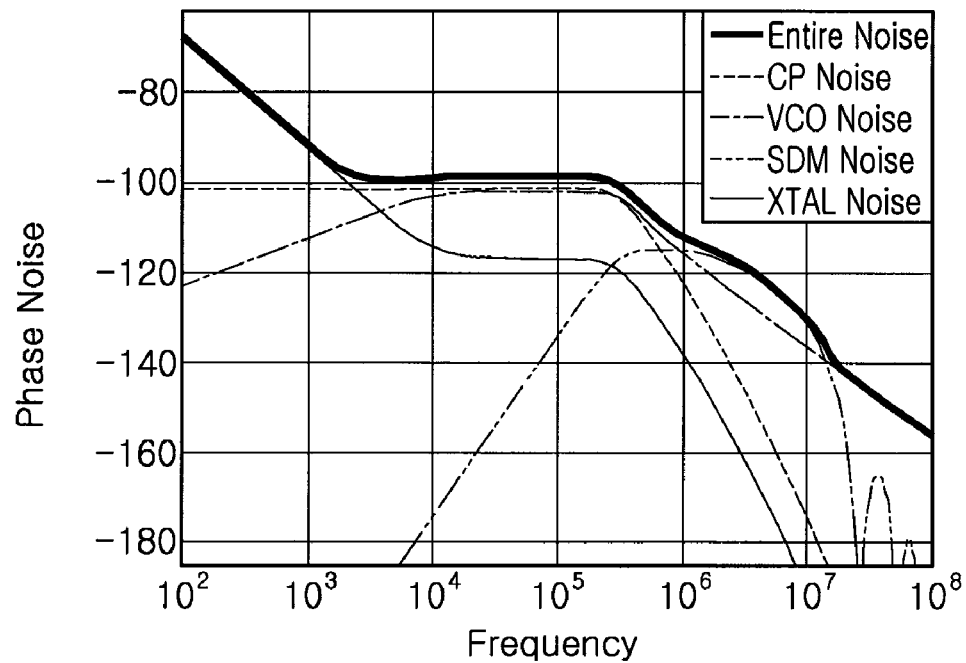

FIG. 6A is a graph illustrating phase noise characteristics of a related art frequency synthesizer, and FIG. 6B is a graph illustrating phase noise characteristics of a frequency synthesizer according to an embodiment of the present invention. Referring to FIGS. 6A and 6B, noise due to a voltage controlled oscillator (VCO) is noticeably reduced, and entire noise of the frequency synthesizer is also reduced according to the reduction of the noise due to the voltage controlled oscillating unit.

As described above, according to the present invention, when the frequency band the voltage controlled oscillating core can output is changed by variations in factors including a temperature, the operation band automatically changed such that the voltage controlled oscillating core capable of outputting a desired frequency operates. Also, it is possible to provide a bias current that can minimize noise to the relevant core and the relevant operation band through the lookup table, to reduce the entire noise of the frequency synthesizer. Furthermore, it is possible to automatically change the band the prescaler operates, according to variations in the frequency output from the voltage controlled oscillator.

According to the present invention, it is possible to automatically change the operation band of the voltage controlled oscillating core operated by a predetermined range of control voltages according to variations in a temperature or a process, and provide an appropriate bias current for the changed operation band to the voltage controlled oscillating core.

According to the present invention, it is also possible to determine an appropriate operation band of the prescaler according to a frequency band output from the voltage controlled oscillating core.

Accordingly, the frequency synthesizer of the present invention can generate a frequency having excellent noise characteristics.

While the present invention has been shown and described in connection with the exemplary embodiments, it will be apparent to those skilled in the art that modifications and variations can be made without departing from the spirit and scope of the invention as defined by the appended claims.

What is claimed is:

1. A frequency synthesizer comprising:
a multi-band voltage controlled oscillator comprising a plurality of voltage controlled oscillating cores outputting oscillation frequencies having different bands according to an input control voltage, the plurality of voltage controlled oscillating cores outputting a frequency band divided into a plurality of bands, each voltage controlled oscillating core outputting one of said divided bands, one of the voltage controlled oscillating cores operating in one of the bands according to the control voltage;
a comparator unit comparing the control voltage with a pre-set reference voltage range; and
an oscillation band-determining unit changing the band where the voltage controlled oscillating core operates into another one of the bands when the control voltage is out of the pre-set reference voltage range, wherein the oscillation band-determining unit comprises,
an up/down counter generating an up-count signal when the control voltage is greater than the maximum value of the reference voltage range, and generating a down-count signal when the control voltage is less than the minimum value of the reference voltage range;
a first lookup table storing information about the respective bands corresponding to the plurality of voltage controlled oscillating cores and information about bias currents provided to the plurality of voltage controlled oscillating cores by each of the bands;
a bias current-supplying unit, when the up-count signal is generated, providing the relevant voltage controlled oscillating core with the bias current corresponding to a high frequency band among the bands adjacent to the band where the voltage controlled oscillating core is operating, by referring to the first lookup table, the bias current-supplying unit, when the down-count signal is generated, providing the relevant voltage controlled oscillating core with the bias current corresponding to a low frequency band among the bands adjacent to the band where the voltage controlled oscillating core is operating, by referring to the first lookup table; and
a prescaler converting the oscillation frequencies output from the voltage controlled oscillator through a prescale operation, the prescaler having a plurality of different operation bands according to the oscillation frequencies,
wherein the oscillation band-determining unit further comprises a second lookup table storing information about the operation band of the prescaler corresponding to the frequency band that each of the voltage controlled oscillating cores has, and
when the up-count signal is generated, the prescaler changes the operation band into the operation band corresponding to a high frequency band among the bands adjacent to the band where the voltage controlled oscillating core is operating, by referring to the second lookup table, and
when the down-count signal is generated, the prescaler changes the operation band into the operation band corresponding to a low frequency band among the bands adjacent to the band, where the voltage controlled oscillating core is operating, by referring to the second lookup table.

2. A frequency synthesizer comprising:
a multi-band voltage controlled oscillator comprising a plurality of voltage controlled oscillating cores outputting oscillation frequencies having different bands according to an input control voltage, the plurality of voltage controlled oscillating cores outputting a frequency band divided into a plurality of bands, each voltage controlled oscillating core outputting one of said divided bands, one of the voltage controlled oscillating cores operating in one of the bands according to the control voltage;
a comparator unit comparing the control voltage with a pre-set reference voltage range; and
an oscillation band-determining unit changing the band where the voltage controlled oscillating core operates into another one of the bands when the control voltage is out of the pre-set reference voltage range, wherein the oscillation band-determining unit further comprises a first lookup table storing information about an operation band of a prescaler corresponding to the frequency band that each of the voltage controlled oscillating cores has, and when the band where the voltage controlled oscillating core is operating is changed into another one of the bands, the prescaler changes the operation band into the operation band corresponding to the changed band of the voltage controlled oscillating core, by referring to the first lookup table.

3. The frequency synthesizer of claim 2, wherein the comparator unit comprises:
a first comparator comparing the control voltage with a maximum value of the reference voltage range; and
a second comparator comparing the control voltage with a minimum value of the reference voltage range.

4. The frequency synthesizer of claim 2, wherein the oscillation band-determining unit comprises:
an up/down counter generating an up-count signal when the control voltage is greater than the maximum value of the reference voltage range, and generating a down-count signal when the control voltage is less than the minimum value of the reference voltage range;
a second lookup table storing information about the respective bands corresponding to the plurality of voltage controlled oscillating cores and information about bias currents provided to the plurality of voltage controlled oscillating cores by each of the bands; and
a bias current-supplying unit, when the up-count signal is generated, providing the relevant voltage controlled oscillating core with the bias current corresponding to a high frequency band among the bands adjacent to the band where the voltage controlled oscillating core is operating, by referring to the second lookup table, the bias current-supplying unit, when the down-count signal is generated, providing the relevant voltage controlled oscillating core with the bias current corresponding to a low frequency band among the bands adjacent to the band where the voltage controlled oscillating core is operating, by referring to the second lookup table.

5. A frequency synthesizer comprising:
a multi-band voltage controlled oscillator comprising a plurality of voltage controlled oscillating cores outputting oscillation frequencies having different bands according to an input control voltage, the plurality of voltage controlled oscillating cores outputting a frequency band divided into a plurality of bands, each voltage controlled oscillating core outputting one of said divided bands, one of the voltage controlled oscillating cores operating in one of the bands according to the control voltage;
a comparator unit comparing the control voltage with a pre-set reference voltage range;
a prescaler converting the oscillation frequencies output from the voltage controlled oscillator through a prescale operation, the prescaler having a plurality of different operation bands according to the oscillation frequencies; and
an oscillation band-determining unit changing the band where the voltage controlled oscillating core operates into another one of the bands when the control voltage is out of the pre-set reference voltage range, wherein the oscillation band-determining unit further comprises a first lookup table storing information about an operation band of the prescaler corresponding to the frequency band that each of the voltage controlled oscillating cores has, and when the band where the voltage controlled oscillating core is operating is changed into another one of the bands, the prescaler changes the operation band into the operation band corresponding to the changed band of the voltage controlled oscillating core, by referring to the first lookup table.

6. The frequency synthesizer of claim 5, wherein the comparator unit comprises:
a first comparator comparing the control voltage with a maximum value of the reference voltage range; and
a second comparator comparing the control voltage with a minimum value of the reference voltage range.

7. The frequency synthesizer of claim 5, wherein the oscillation band-determining unit comprises:
an up/down counter generating an up-count signal when the control voltage is greater than the maximum value of the reference voltage range, and generating a down-count signal when the control voltage is less than the minimum value of the reference voltage range;
a second lookup table storing information about the respective bands corresponding to the plurality of voltage controlled oscillating cores and information about bias currents provided to the plurality of voltage controlled oscillating cores by each of the bands; and
a bias current-supplying unit, when the up-count signal is generated, providing the relevant voltage controlled oscillating core with the bias current corresponding to a high frequency band among the bands adjacent to the band where the voltage controlled oscillating core is operating, by referring to the second lookup table, the bias current-supplying unit, when the down-count signal is generated, providing the relevant voltage controlled oscillating core with the bias current corresponding to a low frequency band among the bands adjacent to the band where the voltage controlled oscillating core is operating, by referring to the second lookup table.

* * * * *